United States Patent
Takai et al.

(10) Patent No.: US 11,424,133 B2
(45) Date of Patent: Aug. 23, 2022

(54) METAL STRUCTURE AND METHOD OF MANUFACTURING THE SAME AND METAL WIRE AND SEMICONDUCTOR DEVICE AND ELECTRONIC DEVICE

(71) Applicant: SAMSUNG ELECTRONICS CO., LTD., Suwon-si (KR)

(72) Inventors: Kenji Takai, Waseong-si (KR); Do Yoon Kim, Hwaseong-si (KR); Boun Yoon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 210 days.

(21) Appl. No.: 16/825,237

(22) Filed: Mar. 20, 2020

(65) Prior Publication Data

US 2021/0028024 A1    Jan. 28, 2021

(30) Foreign Application Priority Data

Jul. 25, 2019 (KR) .................. 10-2019-0090524
Dec. 10, 2019 (KR) .................. 10-2019-0163597

(51) Int. Cl.
*H01L 21/321* (2006.01)
*H01L 21/768* (2006.01)
(Continued)

(52) U.S. Cl.
CPC ........ *H01L 21/3212* (2013.01); *B24B 37/044* (2013.01); *C09G 1/04* (2013.01);
(Continued)

(58) Field of Classification Search
CPC ............. H01L 21/3212; H01L 21/2885; H01L 21/76802; H01L 21/76834; H01L 21/7684;
(Continued)

(56) References Cited

U.S. PATENT DOCUMENTS 6,861,756 B2    3/2005  Saito et al.
7,247,946 B2    7/2007  Bruley et al.
(Continued)

FOREIGN PATENT DOCUMENTS

CN    102881651    * 10/2015
EP    0932913 A1    8/1999
(Continued)

OTHER PUBLICATIONS

P. M. Vereecken, et al., The chemistry of additives in damascene copper plating, IBM J. Res. & Dev. vol. 49 No. 1 Jan. 2005, 16 pgs.
(Continued)

*Primary Examiner* — Thanhha S Pham
(74) *Attorney, Agent, or Firm* — Cantor Colburn LLP

(57) ABSTRACT

A method of manufacturing a metal structure including forming a metal layer including a metal and a nano-abrasive and supplying slurry on the metal layer to perform chemical mechanical polishing, a metal structure including a metal and a nano-abrasive having an average particle diameter of less than about 5 nanometers, and a metal wire, a semiconductor device, and an electronic device including the same.

9 Claims, 6 Drawing Sheets

(51) Int. Cl.
*H01L 21/288* (2006.01)
*C09G 1/04* (2006.01)
*C09K 3/14* (2006.01)
*B24B 37/04* (2012.01)

(52) U.S. Cl.
CPC ........ *C09K 3/1409* (2013.01); *H01L 21/2885* (2013.01); *H01L 21/7684* (2013.01); *H01L 21/76802* (2013.01); *H01L 21/76834* (2013.01); *H01L 21/76843* (2013.01); *H01L 21/76877* (2013.01)

(58) Field of Classification Search
CPC ......... H01L 21/76843; H01L 21/76877; H01L 23/53276; B24B 37/044; C09G 1/04; C09K 3/1409; C25D 5/48; C25D 7/123; C25D 3/38; C25D 15/00
See application file for complete search history.

(56) References Cited

U.S. PATENT DOCUMENTS

| | | | |
|---|---|---|---|
| 7,332,810 | B2 | 2/2008 | Awano |
| 7,387,957 | B2 | 6/2008 | Saito et al. |
| 7,884,410 | B2 | 2/2011 | Moon et al. |
| 7,923,283 | B2 | 4/2011 | Awano et al. |
| 8,193,030 | B2 | 6/2012 | Moon et al. |
| 8,384,220 | B2 | 2/2013 | Saito et al. |
| 9,214,359 | B2 | 12/2015 | Chopra |
| 2001/0055880 | A1 | 12/2001 | Li et al. |
| 2012/0146220 | A1 | 6/2012 | Sasajima et al. |
| 2014/0308811 | A1 | 10/2014 | Sasajima et al. |

FOREIGN PATENT DOCUMENTS

| | | | |
|---|---|---|---|
| JP | 1999135630 | A | 5/1999 |
| JP | 2000510289 | A | 8/2000 |
| JP | 2001250824 | A | 9/2001 |
| JP | 2001337766 | A | 12/2001 |
| JP | 2002329723 | A | 11/2002 |
| JP | 2003158093 | A | 5/2003 |
| JP | 2005116912 | A | 4/2005 |
| JP | 2005136433 | A | 5/2005 |
| JP | 2005223278 | A | 8/2005 |
| JP | 2005320475 | A | 11/2005 |
| JP | 2006203197 | A | 8/2006 |
| JP | 2007053199 | A | 3/2007 |
| JP | 2008041954 | A | 2/2008 |
| JP | 2009065207 | A | 3/2009 |
| JP | 2010206212 | A | 9/2010 |
| JP | 4560278 | B2 | 10/2010 |
| JP | 5205670 | B2 | 6/2013 |
| JP | 5245385 | B2 | 7/2013 |
| JP | 2013251380 | A | 12/2013 |
| KR | 1020050117713 | A | 12/2005 |
| KR | 0576465 | B1 | 4/2006 |
| KR | 100846502 | B1 | 7/2008 |
| KR | 0869044 | B1 | 11/2008 |
| KR | 101100703 | B1 | 12/2011 |
| WO | 1998027585 | A1 | 6/1998 |
| WO | 2010064732 | A1 | 6/2010 |

OTHER PUBLICATIONS

Chandramouli Subramaniam, et al., One hundred fold increase in current carrying capacity in a carbon nanotube-copper composite, Nature Communications, 4:2202, 2013, pp. 1-7.
ITRS 2013 Edition (JEITIA), Chapter 3, 25 pp.
ITRS 2013 Edition (JEITIA), Chapter 5, 24 pp.
Katsuaki Kawasum, et al., A grossly warped nanographene and the consequences of multiple odd-memberedring defects, Nature Chemistry, vol. 5, Sep. 2013, www.nature.com/naturechemistry, 739-744.
Large Scale Simulations On Nano-Carbon Material For Reducing Environmental Load, 12 pp., Zeon Corp., Nov. 2013.
Masatsugu Fujishige, et al., Electric Contact Characteristic under Low Load of Silver-Carbon Nanotube Composite Plating Film Corroded Using H2S Gas, Applied Physics Express 3 (2010) 065801-1-065801-3.
Nature, vol. 444, Nov. 16, 2006, p. 286.
Radovan Kukobat, et al., Sol-gel chemistry mediated Zn/Al-based complex dispersant for SWCNT in water without foam formation, Carbon 94 (2015) 518-523.

\* cited by examiner

METAL STRUCTURE AND METHOD OF MANUFACTURING THE SAME AND METAL WIRE AND SEMICONDUCTOR DEVICE AND ELECTRONIC DEVICE

CROSS-REFERENCE TO RELATED APPLICATION

This application claims priority to Korean Patent Application No. 10-2019-0090524 filed on Jul. 25, 2019, and Korean Patent Application No. 10-2019-0163597 Dec. 10, 2019, and all the benefits accruing therefrom under 35 U.S.C. § 119, the contents of which in their entirety is herein incorporated by reference.

BACKGROUND

1. Field

A metal structure, a method of manufacturing the same, a metal wire, a semiconductor device, and an electronic device are disclosed.

2. Description of the Related Art

Recently, as electronic devices are down-sized and integrated circuits are miniaturized, various methods of forming fine metal structures such as metal wires on the scale of several nanometers have been of interest and researched. During the formation of the fine metal structure, a polishing process may be performed to make a flat surface of the fine metal structure. One of the polishing processes may be chemical mechanical polishing (CMP). The chemical mechanical polishing includes a planarization process of a surface of a substrate by providing a polishing slurry including an abrasive between a semiconductor substrate and a polishing pad to perform the polishing process, and contacting the semiconductor substrate with the polishing pad. However, the polishing slurry including an abrasive such as silica may cause damage and shape deformation of the fine metal structure.

SUMMARY

An embodiment provides a method of manufacturing a metal structure capable of improving a polishing rate while reducing damage and shape deformation of the metal structure.

Another embodiment provides a metal structure obtained by the method.

Another embodiment provides a method of manufacturing a semiconductor device using the method of manufacturing the metal structure.

Another embodiment provides a metal wire including the metal structure.

Another embodiment provides a semiconductor device including the metal wire.

Another embodiment provides an electronic device including the metal wire or the semiconductor device.

According to an embodiment, a method of manufacturing a metal structure includes forming a metal layer including a metal and a nano-abrasive and supplying slurry to the surface of the metal layer to perform chemical mechanical polishing.

The slurry may not include an abrasive having an average particle diameter of greater than or equal to about 3 nanometers (nm).

The slurry may be an abrasive-free slurry.

The slurry may include an amino acid or a derivative thereof.

The nano-abrasive may have an average particle diameter of less than about 5 nm.

The nano-abrasive may include a carbon abrasive.

The carbon abrasive may include fullerene or a derivative thereof, graphene, graphite, a carbon nanotube, a carbon dot, or a combination thereof.

The metal may include copper, silver, gold, aluminum, calcium, zinc, tungsten, iron, tin, platinum, nickel, or a combination thereof.

The forming of the metal layer may include preparing an electrodeposition coating solution including a metal salt, the aforementioned nano-abrasive, and a solvent, and disposing a substrate including the conductive layer and an opposite electrode in the electrodeposition coating solution and performing electrodeposition by applying a current between the conductive layer and the opposite electrode.

The metal salt may include a copper salt, a silver salt, a gold salt, an aluminum salt, a calcium salt, a zinc salt, a tungsten salt, an iron salt, a tin salt, a platinum salt, a nickel salt, or a combination thereof.

The substrate may include an insulation layer having a plurality of trenches, and the trenches may be filled with the metal structure.

According to another embodiment, a method of manufacturing a semiconductor device includes forming a metal wire by the manufacturing method.

According to another embodiment, a metal structure obtained by the method is provided.

According to another embodiment, a metal structure includes a metal and a nano-abrasive having an average particle diameter of less than about 5 nm.

The metal may include copper, silver, gold, aluminum, calcium, zinc, tungsten, iron, tin, platinum, nickel, or a combination thereof.

The nano-abrasive may include fullerene or a derivative thereof, graphene, graphite, a carbon nanotube, a carbon dot, or a combination thereof.

The nano-abrasive may have an average particle diameter of less than or equal to about 2 nm.

The resistivity of the metal structure may be about 0.8 times to about 1.2 times the resistivity of the metal.

A width of the metal structure may be less than or equal to about 20 nm.

According to another embodiment, a metal wire including the metal structure is provided.

According to another embodiment, a semiconductor device including the metal wire is provided.

According to another embodiment, an electronic device including the metal wire or the semiconductor device is provided.

The polishing rate may be improved while reducing damage and shape deformation of the metal structure.

BRIEF DESCRIPTION OF THE DRAWINGS

FIGS. 1 to 6 are cross-sectional views sequentially showing a method of manufacturing a metal structure according to an embodiment wherein:

FIG. 1 represents an insulation layer on a substrate;

FIG. 2 represents trenches formed in the insulation layer;

FIG. 3 represents a conductive layer formed on the walls and floor of the trenches;

FIG. 4 represents a metal layer of an embodiment formed on the conductive layer;

FIG. 5 represents a metal structure of an embodiment that is planarized to coincide with a surface of the insulation layer; and FIG. 6 represents a metal structure of an embodiment with a capping layer.

DETAILED DESCRIPTION

Figure 1:

Example embodiments will hereinafter be described in detail, and may be easily performed by a person having an ordinary skill in the related art. However, this disclosure may be embodied in many different forms and is not to be construed as limited to the exemplary embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a method of manufacturing a metal structure according to an embodiment is described. The metal structure may be a pattern having a predetermined width and thickness, and may be a metal wire having a fine line width of less than or equal to about 20 nm, less than or equal to about 15 nm, or less than or equal to about 10 nm. FIGS. 1 to 6 are cross-sectional views sequentially showing a method of manufacturing a metal structure according to an embodiment.

Referring to FIG. 1, an insulation layer 20 is formed on a substrate 10.

The substrate 10 may be an insulation substrate, a metal plate, or a silicon wafer, but is not limited thereto.

The insulation layer 20 may include, for example, a siloxane-based insulating material such as tetraethylorthosilicate (TEOS), an inorganic material such as silicon oxyfluoride (SiOF) or silicon oxycarbide (SiOC); an organic/inorganic material such as a hydrogen-containing polysiloxane-based or a methyl-containing polysiloxane-based insulating material; an organic material such as polyimide, parylene, or a polytetrafluoroethylene such as TEFLON; an air gap, and the like, but is not limited thereto. The insulation layer 20 may be formed by a deposition process such as chemical vapor deposition (CVD) or a solution process such as spin coating, but is not limited thereto.

Figure 2:
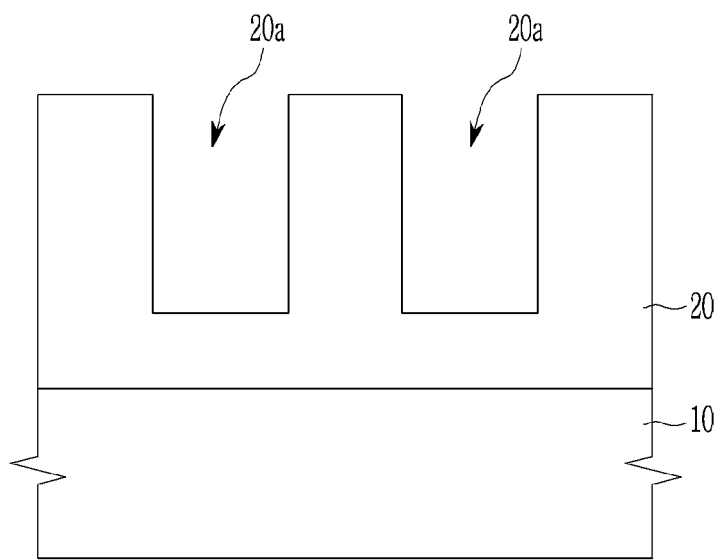

Referring to FIG. 2, a plurality of trenches 20a are formed in the insulation layer 20. The trenches 20a may have a fine line width of less than or equal to about 20 nanometers (nm), less than or equal to about 15 nm, or less than or equal to about 10 nm. The trenches 20a may be for example formed by a photolithography, but is not limited thereto.

Figure 3:
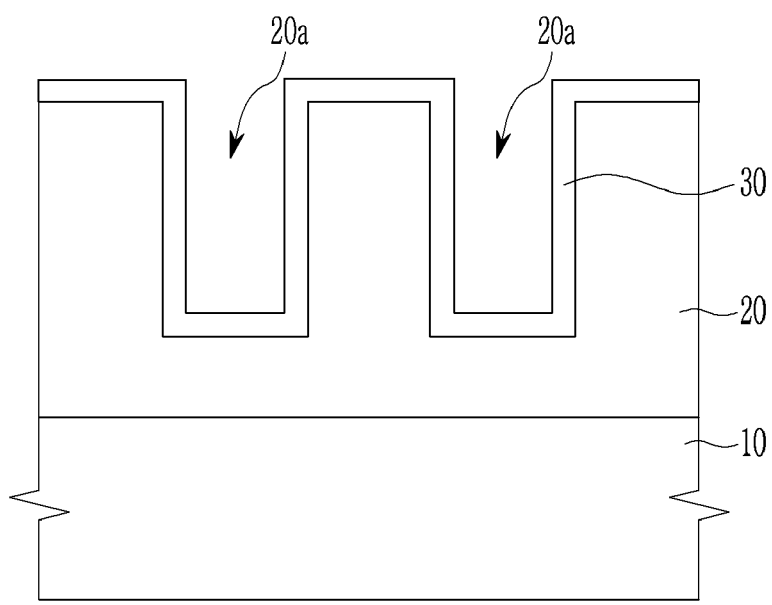

Referring to FIG. 3, a conductive layer 30 is formed on the insulation layer 20. The conductive layer 30 may be for example formed by PVD such as sputtering, but is not limited thereto. The conductive layer 30 may be formed to have a substantially uniform thickness along a surface of the insulation layer 20. The conductive layer 30 may be a barrier layer, a diffusion barrier layer, or an electrodeposition auxiliary layer, but is not limited thereto. The conductive layer 30 may include for example Ta, TaN, or a combination thereof, but is not limited thereto.

Figure 4:
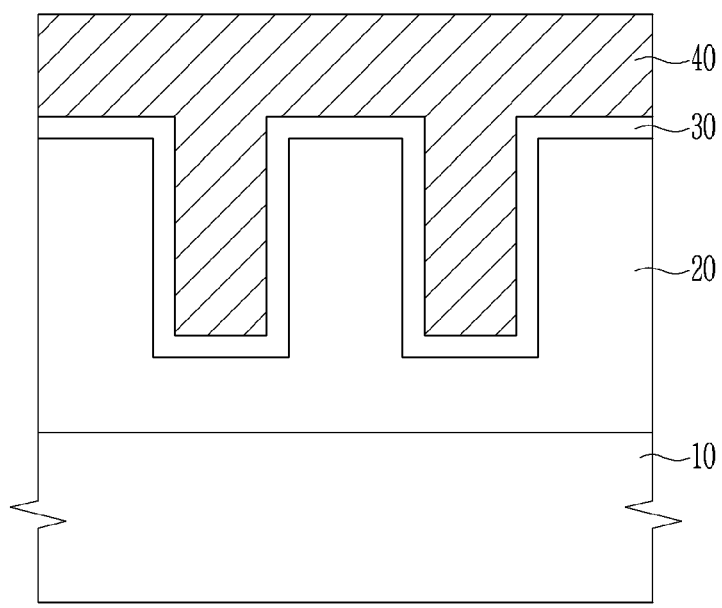

Referring to FIG. 4, the metal layer 40 is formed on the conductive layer 30. The metal layer 40 is a portion in which the metal structure is to be formed, and may be formed in a plurality of trenches 20a of the insulation layer 20 and formed thereon with a predetermined thickness.

The metal layer 40 may include a metal and an abrasive.

The metal may include, for example a low resistance metal, for example copper (Cu), silver (Ag), gold (Au), aluminum (Al), calcium (Ca), zinc (Zn), tungsten (W), iron (Fe), tin (Sn), platinum (Pt), nickel (Ni), an alloy thereof, or a combination thereof.

The abrasive may be nano-abrasives of several nanometers in size, for example nano-abrasives having an average particle diameter of less than about 5 nm. The average particle diameter of the abrasive may be less than or equal to about 4 nm, less than or equal to about 3 nm, less than or equal to about 2 nm, or less than or equal to about 1 nm. For example, the average particle diameter of the abrasive may be greater than or equal to about 0.01 nm and less than about 5 nm, about 0.01 nm to about 4 nm, about 0.01 nm to about 3 nm, about 0.01 nm to about 2 nm, or about 0.01 nm to about 1 nm.

The abrasive may be for example a carbon abrasive consisting of or including carbon and may be a two-dimensional or three-dimensional shaped nanoparticle consisting of carbon or including carbon as a main component. The carbon abrasive may include for example fullerene or a derivative thereof, graphene, graphite, a carbon nanotube, a carbon dot, or a combination thereof.

For example, the carbon abrasive may be fullerene or a derivative thereof. The fullerene may be for example a C60, C70, C74, C76, or C78 fullerene or a derivative thereof, but is not limited thereto.

For example, the fullerene derivative may be a hydrophilic fullerene, and the hydrophilic fullerene may have a structure in which at least one hydrophilic functional group is bonded to the fullerene core. The fullerene core may be for example C60, C70, C74, C76, or C78, but is not limited thereto. The hydrophilic functional group may be for example at least one of a hydroxyl group (—OH), an amino group (—$NHR_2$ wherein the R groups are hydrogen or an organic group such as a C1-12 organic group, preferably a C1-C6 alkyl group; and preferably all R groups are hydrogen), a carbonyl group (—C(=O)—), a carboxyl group (—C(=O)OG wherein G is hydrogen or a counterion), a sulfhydryl group (—SH), or a phosphate group (—P(=O)(OH)(OR)$_2$ wherein the R groups are hydrogen or an organic group such as a C1-12 organic group, preferably a C1-C6 alkyl group; and preferably all R groups are hydrogen), but is not limited thereto. The hydrophilic functional group may be for example a hydroxyl group.

The hydrophilic fullerene may include at least 2 hydrophilic functional groups on average per the fullerene core, for example 2 to 44 hydrophilic functional groups in average, 8 to 44 hydrophilic functional groups in average, 12 to 44 hydrophilic functional groups in average, 24 to 44 hydrophilic functional groups in average, 24 to 40 hydrophilic functional groups in average, 24 to 38 hydrophilic functional groups in average, 32 to 44 hydrophilic functional groups in average, 32 to 40 hydrophilic functional groups in average, or 32 to 38 hydrophilic functional groups on average.

For example, the hydrophilic fullerene may be hydroxyl fullerene, and may be for example represented by $C_x(OH)_y$ (wherein, x may be 60, 70, 74, 76, or 78 and y may be 2 to 44). Herein, the average hydroxyl number of the hydroxyl fullerene may be determined by a method such as elemental analysis, thermogravimetric analysis, spectroscopic analysis, mass spectrometry, and the like, and may be for example an average value of the highest two peaks in a liquid chromatography mass spectrum (LCMS). In an embodiment, the derivative of a fullerene may be a hydrophilic fullerene, and is preferably a hydroxyl fullerene.

For example, the hydrophilic fullerene may be hydroxyl fullerene, and may be for example represented by $C_x(OH)_y$ (wherein, x may be 60, 70, 74, 76, or 78 and y may be 12 to 44).

For example, the hydrophilic fullerene may be hydroxyl fullerene, and may be for example represented by $C_x(OH)_y$ (wherein, x may be 60, 70, 74, 76, or 78 and y may be 24 to 44).

For example, the hydrophilic fullerene may be hydroxyl fullerene, and may be for example represented by $C_x(OH)_y$ (wherein, x may be 60, 70, 74, 76, or 78 and y may be 32 to 44).

The metal layer 40 may be for example formed by a wet deposition process such as an electrodeposition or an electroless deposition or a dry deposition such as a sputtering or a chemical vapor deposition (CVD).

For example, the metal layer 40 may be formed by an electrodeposition, for example, the metal layer 40 may be formed by preparing an electrodeposition coating solution and disposing the substrate 10 and opposite electrode in the electrodeposition coating solution and conducting electrodeposition by applying a current between the conductive layer 30 and the opposite electrode.

The electrodeposition coating solution may include a metal salt that is a precursor of the aforementioned metal and the aforementioned abrasive. The metal salt is a compound including a metal cation and an anion, for example a metal salt that may be reduced to a low resistance metal. For example, the metal salt may be a copper salt, a silver salt, a gold salt, an aluminum salt, a calcium salt, a zinc salt, a tungsten salt, an iron salt, a tin salt, a platinum salt, a nickel salt, or a combination thereof. The metal salt may be for example a copper salt such as a Cu(II) salt, for example cooper sulfate ($CuSO_4.5H_2O$), copper acetate (Cu($CH_3COO$)$_2.H_2O$), copper nitrate (Cu($NO_3$)$_2$), copper formate (Cu(HCOO)$_2$), copper chloride ($CuCl_2.H_2O$), copper cyanide (CuCN), or a combination thereof, but is not limited thereto.

The metal salt may be included in an amount that supplies sufficient metal cations to perform electrodeposition, and may be for example included in an amount of about 0.05 weight percent (wt %) to about 1 wt % based on the electrodeposition coating solution. Within the range, it may be included in an amount of about 0.07 wt % to 0.8 wt %, about 0.1 wt % to about 0.5 wt % or about 0.1 wt % to about 0.3 wt %.

As described above, the abrasive may be nano-abrasives and may be a carbon abrasive as described above.

The abrasive may be included in an amount of about 10 parts by weight to about 100 parts by weight based on 100 parts by weight of the metal salt. Within the range, the abrasive may be included in an amount of about 15 parts by weight to 100 parts by weight, about 15 parts by weight to about 80 parts by weight about 15 parts by weight to about 70 parts by weight, about 15 parts by weight to about 60 parts by weight, about 15 parts by weight to about 50 parts by weight, about 15 parts by weight to about 40 parts by weight, or about 15 parts by weight to about 30 parts by weight.

The electrodeposition coating solution may further include a metal-abrasive composite. The metal-abrasive composite may be a reaction product of the metal cation of the aforementioned metal salt and the aforementioned abrasive, or the metal cation of the metal salt and the abrasive may be chemically bonded. The metal-abrasive composite may be for example formed by a spontaneous reaction in the electrodeposition coating solution at room temperature (about 25° C.).

The electrodeposition coating solution may further include an acid. The acid may for example include at least one of sulfuric acid ($H_2SO_4$), hydrochloric acid (HCl), acetic acid ($CH_3COOH$), fluoroboric acid ($HBF_4$), an alkylsulfonic acid, an arylsulfonic acid, or phosphoric acid, but is not limited thereto.

The acid may be included in an amount of about 0.01 wt % to about 10 wt % based on the electrodeposition coating solution. Within the range, the acid may be included in an amount of about 0.01 wt % to about 8 wt %, about 0.01 wt % to about 7 wt %, about 0.01 wt % to about 5 wt %, or about 0.01 wt % to about 3 wt %.

The electrodeposition coating solution may for example include a leveler, a suppressor, a catalyst, a brightener, a reducing agent, and/or various additives.

The leveler may include at least one of polyethylene imine and a derivative thereof, quaternarized polyethylene imine, polyglycine, poly(allylamine), polyaniline, polyurea, polyacrylamide, poly(melamine-co-formaldehyde), a reaction product of amine and epichlorohydrin, a reaction product of amine, epichlorohydrin, and polyalkylene oxide, a reaction product of amine and polyepoxide, polyvinylpyridine, polyvinylimidazole, polyvinylpyrrolidone or a copolymer thereof, nigrosine, a pentamethyl-pararosaniline halogenic acid salt, a hexamethyl-pararosaniline halogenic acid salt, trialkanolamine and a derivative, or a compound having a functional group of chemical formula N—R—S (wherein R is substituted alkyl, unsubstituted alkyl, substituted aryl, or unsubstituted aryl), but is not limited thereto.

The suppressor may be for example a polymeric material, for example a polyethylene glycol copolymer and/or a polyethylene glycol polypropylene glycol copolymer, but is not limited thereto.

The promoter may include a sulfur-containing compound, a sulfonic acid, a phosphonic acid, or a salt thereof, but is not limited thereto.

The components may each independently be included in a trace amount of for example about 1 ppm to about 100,000 ppm.

The electrodeposition coating solution may further include a solvent that may dissolve or disperse the aforementioned components, and the solvent may be for example water. The water may be any water such as distilled water and/or deionized water.

The electrodeposition coating solution may be acidic, for example having a pH 3.5 or less. The electrodeposition coating solution may for example have pH 3.0 or less, for example pH 2.5 or less or pH 2.0 or less.

Electrodeposition may be performed by disposing the substrate 10 and the opposite electrode on which the conductive layer 30 is formed in the electrodeposition coating solution described above, and applying a current between the conductive layer 30 and the opposite electrode. Herein, a current density may be about 0.1 ampere per square meter (A/m$^2$) to about 1.0 A/m$^2$, but is not limited thereto.

Herein, the abrasive having an average particle diameter of several nanometers may more effectively be positioned in the trenches 20a having a fine width of less than or equal to about 20 nm, less than or equal to about 15 nm, or less than or equal to about 10 nm to effectively fill the trenches 20a and thereby a metal structure having a fine line width may be effectively formed.

The metal layer 40 having a predetermined thickness is formed by the electrodeposition. The metal layer 40 may include the metal derived from the aforementioned metal salt and the abrasive as described above, and the metal and abrasive may be mixed. The metal layer 40 may optionally further include a metal-abrasive composite.

Since the metal layer 40 includes the abrasive having an average particle diameter of several nanometers, electromigration may be effectively suppressed compared with pure metals (not including the abrasive). The electromigration refers to a phenomenon in which metal atoms are diffused in one direction according to motions of electrons, and may cause void and a short circuit in a wire. Without being bound by any particular theory, an abrasive having a several nanometer size causes a relatively strong electronic interaction with a metal and thus suppresses migration of metal atoms. In addition, an abrasive having a several nanometer size in the metal layer 40 has a stable structure and thus may absorb vibration energy generated by heat or a current and reduce vibration of the metal atoms and thus suppress an electromigration.

The metal layer 40 may increase ampacity of the metal layer 40 by including the abrasive having an average particle diameter of several nanometers. The ampacity represents a maximum current-carrying capacity, which may mean that the metal layer 40 has a higher current transport capacity than the pure metal (not including the abrasive). Ampacity of the metal layer 40 may be for example about 1.5 times or more, for example about twice or more, about 3 times or more, about 4 times or more, about 1.5 times to about 20 times, about twice to about 20 times, about 3 times to about 20 times, or about 4 times to about 30 times as that of the pure metal (not including the abrasive).

The abrasive having an average particle diameter of several nanometers included in the metal layer 40 may not affect or diminish the electrical characteristics of the metal layer 40. For example, resistivity of the metal layer 40 may be equal to or lower than that of the pure metal (not including the abrasive), for example, about 0.8 times to about 1.2 times as that of the metal layer 40.

The metal layer 40 includes the abrasive having an average particle diameter of several nanometers and thus may effectively be positioned in the trenches 20a having a fine line width during the electrodeposition and effectively fill in the trenches 20a. Accordingly, a metal structure having the fine line width without a void may be effectively formed and effectively applied to from a fine wire having little or no voids.

Figure 5:
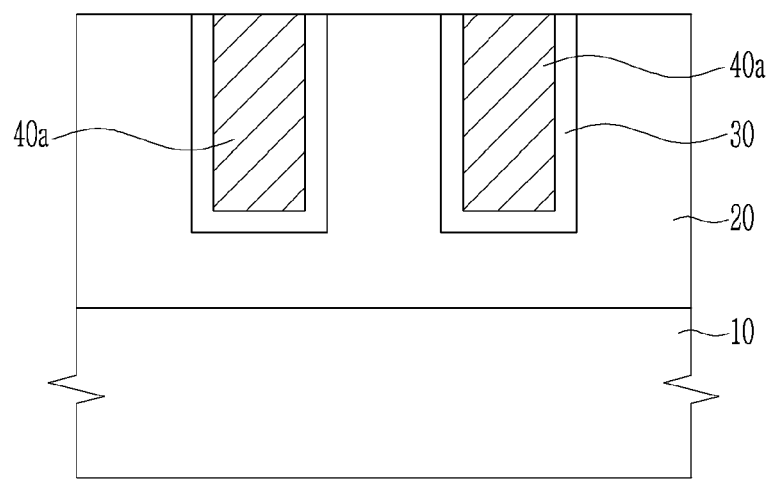

Referring to FIG. 5, the surface of the metal layer 40 is planarized to coincide with the surface of the insulation layer 20 and form a metal structure 40a. The metal structure 40a may be a metal layer filled in the trenches 20a.

The planarization may be performed through chemical mechanical polishing (CMP). The chemical mechanical polishing may be performed to planarize the surface of a substrate by supplying slurry between the metal layer 40 and a polishing pad and then, contacting the metal layer 40 and the polishing pad followed by pressing and rotating the same.

The slurry contacts the metal layer 40 and thus may chemically/mechanically polish the surface of the metal layer 40, and for example, the chemical polishing may be dominant than the mechanical polishing. The slurry may chemically adsorb or dissolve the metal of the metal layer 40 and thus polish the surface of the metal layer 40, and the surface of the metal layer 40 may be effectively removed by the abrasive included in the metal layer 40.

As described above, because the metal layer 40 itself includes an abrasive, the slurry may not include an abrasive having a predetermined size. For example, the slurry may not include an abrasive having an average particle diameter of greater than or equal to about 10 nm, for example, an abrasive having an average particle diameter of about 10 nm to about 100 nm. For example, the slurry may not include an abrasive having an average particle diameter of greater than or equal to about 5 nm, for example, an abrasive having an average particle diameter of about 5 nm to about 100 nm. For example, the slurry may not include an abrasive having an average particle diameter of greater than or equal to about 3 nm, for example, an abrasive having an average particle diameter of about 3 nm to about 100 nm. For example, the slurry may not include an abrasive having an average particle diameter of greater than or equal to about 2 nm, for example, an abrasive having an average particle diameter of about 2 nm to about 100 nm. For example, the slurry may not include an abrasive having an average particle diameter of greater than or equal to about 1 nm, for example, an abrasive having an average particle diameter of about 1 nm to about 100 nm. For example, the slurry may not include an abrasive having an average particle diameter of greater than or equal to about 0.7 nm. For example, an abrasive having an average particle diameter of about 0.7 nm to about 100 nm. For example, the slurry may not include a metal oxide and/or a semi-metal oxide, for example, not include silica, alumina, germania, titania, ceria, and/or zirconium oxide.

For example, the slurry may be not include an abrasive, namely the slurry may be abrasive-free slurry.

The slurry may include an amino acid or a derivative thereof. Because the amino acid has an amino group and a carboxyl group, it may effectively be adsorbed to the metal or may dissolve the metal effectively. The amino acid or the derivative thereof may be for example glycine, lysine, glutamine, alanine, beta-alanine, iminoacetic acid, asparagine, aspartic acid, bicine, tricine, proline, valine, sarcosine, or a combination thereof, but is not limited thereto. Amino acid derivatives as used herein refers to natural or synthetic amino acids and amino acid analogs (e.g., acivicin, dibromotyrosine, 3-hydroxyasparagine) having at least one carboxylic acid group and at least one amino group, and may include a mono-amino acid, a di-amino amino acid, or a higher amino number amino acid; a mono-carboxylic acid, a di-carboxylic monoamino acid or a higher number amino acid; and generally excludes peptides having more than three amino acid or amino acid derivative units, but may include dipeptides such as octopine, or tripeptides such as triglycine. The amino acid or derivative thereof may be in the carboxylic acid or the corresponding carboxylic acid salt form; or the amino acid or derivative thereof may be in the amine or the corresponding ammonium salt form.

For example, the slurry may include two or more amino acids or derivatives, and may include for example glycine as an essential component and together with an amino acid or a derivative thereof other than glycine. The amino acid or the derivative thereof may be for example included in an amount of about 0.01 wt % to 20 wt %, within the range, about 0.01 wt % to about 16 wt %, about 0.01 wt % to about 10 wt %, about 0.01 wt % to about 8 wt %, about 0.05 wt % to about 5 wt %, about 0.1 wt % to about 3 wt % or about 0.2 wt % to about 2 wt % based on a total amount of the slurry (including the solvent).

The slurry may further include an antioxidant (inhibitor). The antioxidant may be for example a nitrogen-containing compound, for example triazole, benzotriazole, methylbenzotriazole, hydroxybenzotriazole, benzoimidazole, benzothiazole, triazinethiol, triazinedithiol, triazinetriol, or a combination thereof. The antioxidant may be for example included in an amount of about 0.1 weight ppm to about 20,000 weight ppm, for example about 20 weight ppm to about 10,000 weight ppm, or about 50 weight ppm to about 1,000 weight ppm based on a total amount of the slurry (including the solvent).

The slurry may further include an oxidizing agent. The oxidizing agent may be for example hydrogen peroxide, a permanganate compound, ammonium persulfate, sodium persulfate, perbenzoic acid, peracetic acid, sodium hydroxide, potassium hydroxide, or a combination thereof, but is not limited thereto. The oxidizing agent may be for example included in an amount of about 0.001 wt % to about 10 wt %, for example about 0.001 wt % to about 5 wt %, about 0.001 wt % to about 4 wt %, about 0.001 wt % to about 3 wt %, or about 0.001 wt % to about 1 wt % based on a total amount of the slurry (including the solvent).

The slurry may further include an additive, and the additive may be for example a chelating agent, a surfactant, a dispersing agent, a pH controlling agent, or a combination thereof, but is not limited thereto.

The chelating agent may be for example oxalic acid, malonic acid, succinic acid, maleic acid, phthalic acid, tartaric acid, aspartic acid, glutamic acid, citric acid, amino carboxylic acid, phosphoric acid, polyphosphoric acid, nitric acid, phosphonic acid, a salt thereof, or a combination thereof, but is not limited thereto.

The surfactant may be an ionic or non-ionic surfactant, for example a copolymer of ethylene oxide, a copolymer of propylene oxide, an amine compound, or a combination thereof, but is not limited thereto.

The dispersing agent may be for example poly(meth)acrylic acid, poly(meth)acryl maleic acid, polyacrylonitrile-co-butadiene-acrylic acid, carboxylic acid, sulfonic ester, sulfonic acid, phosphoric ester, cellulose, diol, a salt thereof, or a combination thereof, but is not limited thereto.

The pH controlling agent may control pH of the slurry and may be for example inorganic acid, organic acid, a salt thereof, or a combination thereof. The inorganic acid may include for example nitric acid, hydrochloric acid, phosphoric acid, sulfuric acid, hydrofluoric acid, bromic acid, iodic acid or a salt thereof, the organic acid may include for example formic acid, malonic acid, maleic acid, oxalic acid, adipic acid, citric acid, acetic acid, propionic acid, fumaric acid, lactic acid, salicylic acid, benzoic acid, succinic acid, phthalic acid, butyric acid, glutaric acid, glutamic acid, glycolic acid, lactic acid, aspartic acid, tartaric acid, or a salt thereof, but is not limited thereto.

Each additive may be each independently for example included in a trace amount of about 1 ppm to about 100,000 ppm, but is not limited thereto.

The slurry may further include a solvent capable of dissolving or dispersing the above components and the solvent may be for example water. The water may be for example distilled water and/or deionized water. The pH of the slurry may be about 1 to about 12.

The slurry may be supplied over a polishing pad, and chemical mechanical polishing may be performed by contacting and rotating the surface of the metal layer 40 with the polishing pad. A predetermined pressure may be applied in the polishing step, and may be for example a pressure of about 1 pounds per square inch (psi) to about 5 psi, about 1.2 psi to about 3 psi, about 1.3 psi to about 3 psi, about 2 psi to about 2 psi, or about 1.3 psi to about 2.3 psi may be applied.

The chemical mechanical polishing may be performed, for example over three steps, wherein the first step is to remove an upper portion of the metal layer 40, that is, a bulk metal having a predetermined thickness, the second step is to finely remove a predetermined metal remaining on the conductive layer 30, and the third step is to remove the conductive layer 30. See, for example, FIGS. 4 and 5. The first step may be performed at a high polishing rate under a relatively high pressure, for example, at a polishing rate of about 6000 Å/min under a pressure of greater than or equal to about 2.5 psi. The second and/or third step may be performed at a low polishing rate under a relatively low pressure, for example, at a polishing rate of about 3000 to about 4000 angstroms per minute (Å/min) under a pressure of less than or equal to about 1.5 psi.

Figure 6:
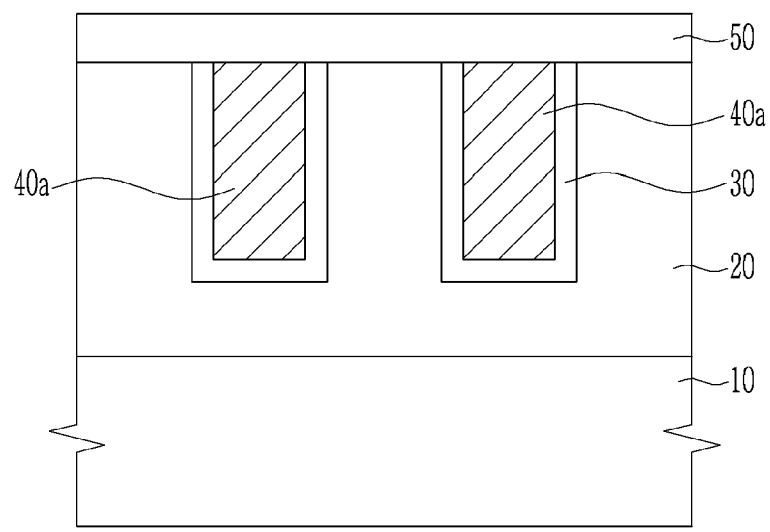

Referring to FIG. 6, a capping layer 50 is formed on the metal structure 40a and the insulation layer 20. The capping layer 50 may include silicon nitride (SiN) and/or silicon carbide (SiC), but is not limited thereto.

The metal structure 40a obtained according to the aforementioned method may be for example a metal wire, for example, a fine metal wire having less than or equal to about 20 nm, less than or equal to about 15 nm, or less than or equal to about 10 nm, for example, a fine metal wire having a fine line width without a void. The aforementioned method may be effectively used to form various devices including the metal structure 40a, for example, to form a metal wire for a semiconductor device.

The metal wire may be included in various semiconductor devices. The metal wire and/or semiconductor device may be included in various electronic devices and may be included in a semiconductor device or a display device.

Hereinafter, the embodiments are illustrated in more detail with reference to examples. However, these examples are exemplary, and the present disclosure is not limited thereto.

Synthesis Examples

Synthesis Example of Hydroxyl Fullerene 10 grams (g) of a hydroxyl fullerene precursor ($C_{60}(OH)_{6-12}$, Nanom Spectra D100, Frontier Carbon Corp.) is dispersed in a 30% hydrogen peroxide solution and stirred at 60° C. for 48 hours in a flask to synthesize hydroxyl fullerene ($C_{60}(OH)_{24-36}$, Peak: $C_{60}(OH)_{31}$). The hydroxyl fullerene has an average particle diameter of about 1 nm as measured by a dynamic light scattering method (SUPTEX).

Preparation of Electrodeposition Coating Solution

Preparation Example 1 and Comparative Preparation Example 1

An electrodeposition coating solution is prepared as described in Table 1. An electrodeposition coating solution is prepared by using the hydroxyl fullerene according to Synthesis Example as a nano-abrasive. Components except for the hydroxyl fullerene and $H_2SO_4$ are first mixed, and then, the hydroxyl fullerene and $H_2SO_4$ are added to and mixed with the other components listed in Table 1. The amounts listed are in grams per Liter (g/L).

TABLE 1

|  | Preparation Example 1 (g/L) | Comparative Preparation Example 1 (g/L) |
|---|---|---|
| Hydroxy fullerene | 20 | — |
| Polyacrylic acid | 1 | 1 |
| $CuSO_4 \cdot 5H_2O$ | 60 | 60 |
| $H_2SO_4$ | small amount | 182 |
| NaCl | 0.08 | 0.08 |
| SPS | 0.002 | 0.002 |
| JGB | 0.01 | 0.01 |

* Polyacrylic acid: Wako Pure Chemical Industries, Ltd.
* $CUSO_4 \cdot 5H_2O$: Kanto Chemical Co., Inc.
* SPS: 3,3'-dithiobis(1-propanesulfonic acid) disodium: Tokyo Chemical Industry Co., Ltd.
* JGB: Janus Green B: Tokyo Chemical Industry Co., Ltd.
* pH: 0.0-2.0 (pH Meter SP-2100, SUPTEX)

Preparation of Slurry

Preparation Example 2

0.06 wt % of benzotriazole, 0.04 wt % of ammonium dihydrogen phosphate, 0.5 wt % of triammonium citrate, 1.6 wt % of $H_2O_2$, and a balance amount of water are mixed to prepare a slurry.

Preparation Example 3

0.02 wt % of 1,2,4-triazole, 1.0 wt % of $H_2O_2$, 0.6 wt % of glycine, and a balance amount of water are mixed to prepare a slurry.

Preparation Example 4

0.02 wt % of 1,2,4-triazole, 1.0 wt % of $H_2O_2$, 0.6 wt % of glycine, 0.2 wt % of bicine, and a balance amount of water are mixed to prepare a slurry.

Preparation Example 5

0.1 wt % of the hydroxyl fullerene according to Synthesis Example, 0.06 wt % of benzotriazole, 0.04 wt % of ammonium dihydrogen phosphate, 0.5 wt % of triammonium citrate, 1.6 wt % of $H_2O_2$, and a balance amount of water are mixed to prepare a slurry.

Comparative Preparation Example 2

1 wt % of silica (PL-1 having a primary particle diameter of 15 nm, FUSO CHEMICAL), 0.06 wt % of benzotriazole, 0.4 wt % of ammonium dihydrogen phosphate, 0.5 wt % of triammonium citrate, 1.6 wt % of $H_2O_2$, and a balance amount of water are mixed to prepare slurry.

EXAMPLES

Example 1

An MIT854 patterned silicon wafer having a TEOS layer and Cu layer (a patterned Wafer) as an evaluation sample is used, and a Ta/TaN conductive layer is formed thereon. Subsequently, an about 1 micrometer (μm) thick Cu layer is formed by disposing the Ta/TaN conductive layer of the silicon wafer (cathode) and an opposite electrode (anode) to face each other in an electrodeposition coating solution according to Preparation Example 1 and then, turning on the power between the anode and the cathode to apply a current with various average current densities (0.1 ampere per square decimeter ($A/dm^2$) to 1.0 $A/dm^2$) to perform an electrodeposition for 45 minutes. Subsequently, the slurry according to Preparation Example 2 is supplied to perform chemical mechanical polishing under a pressure of 1.5 psi by using a chemical mechanical polishing device (MirraR, Applied Material, Inc.) to form a Cu structure.

Example 2

A Cu structure is formed according to the same method as Example 1 except that the slurry of Preparation Example 3 is used instead of the slurry of Preparation Example 2.

Example 3

A Cu structure is formed according to the same method as Example 1 except that the slurry of Preparation Example 4 is used instead of the slurry of Preparation Example 2.

Example 4

A Cu structure is formed according to the same method as Example 1 except that the slurry of Preparation Example 5 is used instead of the slurry of Preparation Example 2.

Comparative Example 1

A Cu structure is formed according to the same method as Example 1 except that the slurry of Comparative Preparation Example 2 is used instead of the slurry of Preparation Example 2.

Comparative Example 2

A Cu structure is formed according to the same method as Example 1 except that the electrodeposition coating solution of Comparative Preparation Example 1 is used instead of the electrodeposition coating solution of Preparation Example 1.

Comparative Example 3

A Cu structure is formed according to the same method as Example 1 except that the electrodeposition coating solution of Comparative Preparation Example 1 instead of the electrodeposition coating solution of Preparation Example 1 and the slurry of Comparative Preparation Example 2 instead of the slurry of Preparation Example 2 are used.

Comparative Example 4

A Cu structure is formed according to the same method as Example 1 except that the electrodeposition coating solution of Comparative Preparation Example 1 instead of the electrodeposition coating solution of Preparation Example 1 and the slurry of Preparation Example 3 instead of the slurry of Preparation Example 2 are used.

Comparative Example 5

A Cu structure is formed according to the same method as Example 1 except that the electrodeposition coating solution of Comparative Preparation Example 1 instead of the electrodeposition coating solution of Preparation Example 1 and the slurry of Preparation Example 4 instead of the slurry of Preparation Example 2 are used.

Evaluation I

The electrical characteristics of the Cu structures obtained in the Examples and Comparative Examples are evaluated.

The electrical characteristics are evaluated by resistivity in nanoohms meter (nΩ·m) and ampacity in megaampere per square centimeter (MA/cm$^2$). The ampacity is defined as a current capacity having resistivity (Dr/r$_0$) of greater than 1 where Dr/r$_0$ is relative resistance change, r$_0$ is the initial resistance and r is the final resistance, and the resistivity increases as the current increases beyond the ampacity.

The results are shown in Table 2.

TABLE 2

|  | Resistivity (nΩ·m) | Ampacity (MA/cm$^2$) |
| --- | --- | --- |
| Example 1 | 17 | 28 |
| Example 2 | 17 | 28 |
| Example 3 | 17 | 28 |
| Example 4 | 17 | 28 |
| Comparative Example 1 | 17 | 28 |
| Comparative Example 2 | 20 | 6 |
| Comparative Example 3 | 20 | 6 |
| Comparative Example 4 | 20 | 6 |
| Comparative Example 5 | 20 | 6 |

Referring to Table 2, the Cu structures according to Examples 1 to 4 exhibit improved electrical characteristics compared with the Cu structures according to Comparative Examples 1 to 5. For example, the Examples 1 to 4 have significantly ampacity than Comparative Examples 2 to 5.

Evaluation II

The polishing characteristics and of the Cu structures obtained in the Examples and Comparative Examples are evaluated.

The polishing characteristics are evaluated by material removal rate (MRR) in angstroms per minute. The material removal rate (MRR) is calculated by converting thicknesses of a tungsten film before and after the polishing into sheet resistance, and using the sheet resistance for conversion into a material removal rate.

The damages of Cu structures are evaluated by number of scratch per each wafer (ea/wf), dishing (angstroms), and erosion (angstroms). The results are shown in Table 3.

TABLE 3

|  | MRR(Å/min) | Scratch(ea/wf) | Dishing(Å) | Erosion(Å) |
| --- | --- | --- | --- | --- |
| Example 1 | 4500 | 0 | 150 | <100 |
| Example 2 | 5200 | 0 | 90 | <100 |
| Example 3 | 5500 | 0 | 70 | <100 |
| Example 4 | 4800 | 3 | 260 | <100 |
| Comparative Example 1 | 4500 | 12 | 660 | 530 |
| Comparative Example 2 | <1000 | — | — | — |
| Comparative Example 3 | 3800 | 14 | 620 | 470 |
| Comparative Example 4 | <1000 | — | — | — |
| Comparative Example 5 | <1000 | — | — | — |

Referring to Table 3, the Cu structures according to Examples 1 to 4 exhibit small damage and shape deformation and an equivalent or improved polishing rate compared with the Cu structures according to Comparative Examples 1 to 5.

Comprehensively referring to Tables 2 and 3, the Cu structures according to Examples may reduce defects due to the damage and shape deformation after the polishing as well as exhibit improved electrical characteristics and an equivalent or improved polishing rate compared with the Cu structures according to Comparative Examples. As a result, a fine metal structure having little or no voids and improved performance may be formed depending on the electrodeposition coating solution in the electrodeposition process and the slurry used in the polishing process.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of manufacturing a metal structure, the method comprising:
    forming a metal layer comprising a metal and a nano-abrasive, the nano-abrasive having an average particle diameter of less than 5 nanometers, wherein the forming of the metal layer comprises: preparing an electrodeposition coating solution comprising a metal salt, the nano-abrasive, and a solvent, and disposing a substrate comprising a conductive layer and an opposite electrode in the electrodeposition coating solution and performing electrodeposition by applying a current between the conductive layer and the opposite electrode; and
    supplying slurry on the metal layer to perform chemical mechanical polishing.

2. The method of claim 1, wherein the slurry does not comprise an abrasive having an average particle diameter of greater than or equal to about 3 nanometers.

3. The method of claim 1, wherein the slurry is an abrasive-free slurry.

4. The method of claim 1, wherein the slurry comprises an amino acid or a derivative thereof.

5. The method of claim 1, wherein the nano-abrasive comprises a carbon abrasive.

6. The method of claim 5, wherein the carbon abrasive comprises fullerene or a derivative thereof, graphene, graphite, a carbon nanotube, a carbon dot, or a combination thereof.

7. The method of claim 1, wherein the metal comprises copper, silver, gold, aluminum, calcium, zinc, tungsten, iron, tin, platinum, nickel, or a combination thereof.

8. The method of claim 1, wherein the metal salt comprises a copper salt, a silver salt, a gold salt, an aluminum salt, a calcium salt, a zinc salt, a tungsten salt, an iron salt, a tin salt, a platinum salt, a nickel salt, or a combination thereof.

9. A method of manufacturing a semiconductor device comprising forming a metal wire by the manufacturing method of claim 1.

* * * * *